(12) United States Patent
Kim et al.

(10) Patent No.: US 12,128,401 B2
(45) Date of Patent: *Oct. 29, 2024

(54) MICROFLUIDIC MODULE AND METHOD OF FABRICATING THE MICROFLUIDIC MODULE

(71) Applicant: UNIST(ULSAN NATIONAL INSTITUTE OF SCIENCE AND TECHNOLOGY), Ulsan (KR)

(72) Inventors: Taesung Kim, Ulsan (KR); Juyeol Bae, Ulsan (KR)

(73) Assignee: UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 151 days.

This patent is subject to a terminal disclaimer.

(21) Appl. No.: 17/947,207

(22) Filed: Sep. 19, 2022

(65) Prior Publication Data

US 2023/0095313 A1 Mar. 30, 2023

(30) Foreign Application Priority Data

Sep. 24, 2021 (KR) ........................ 10-2021-0126358

(51) Int. Cl.
*B29C 33/38* (2006.01)
*B01L 3/00* (2006.01)
(Continued)

(52) U.S. Cl.
CPC .... *B01L 3/502707* (2013.01); *B29C 33/3842* (2013.01); *B29C 33/52* (2013.01);
(Continued)

(58) Field of Classification Search
CPC ............ G03F 7/0017; B29C 2043/025; B29C 2043/023; B29C 41/02; B29C 39/026
See application file for complete search history.

(56) References Cited

U.S. PATENT DOCUMENTS 5,169,573 A * 12/1992 Tsuchida ................. E04F 21/04
264/246
6,355,198 B1 * 3/2002 Kim ..................... B81C 1/00031
264/299

FOREIGN PATENT DOCUMENTS

JP 2010-524713 A 7/2010
KR 2010-524713 A 7/2010
(Continued)

OTHER PUBLICATIONS

Leclerc, E., Y. Sakai, T. Fujii, Microfluidic PDMS (Polydimethylsiloxane) Bioreactor for Large-Scale Culture of Hepatocytes, Biotechnol. Prog., vol. 20 (2004) pp. 750-755. (Year: 2004).*

(Continued)

*Primary Examiner* — Matthew J Daniels
(74) *Attorney, Agent, or Firm* — Revolution IP, PLLC (57) ABSTRACT

Provided is a microfluidic film including a first microfluidic film including a first base film, a first microchannel, which is formed on the first base film and through which a fluid flows, and a first through passage, which is configured to pass through the first base film, and a second microfluidic film including a second base film being stacked on the first base film and a second through passage, which is configured to pass through the second base film and communicates with the first through passage.

9 Claims, 10 Drawing Sheets

(51) Int. Cl.
  *B29C 33/52* (2006.01)
  *B81C 1/00* (2006.01)
  *B29K 83/00* (2006.01)

(52) U.S. Cl.
  CPC ... *B81C 1/00119* (2013.01); *B01L 2300/0874* (2013.01); *B29K 2083/00* (2013.01); *B81C 2201/0108* (2013.01)

(56) References Cited

FOREIGN PATENT DOCUMENTS

| KR | 10-1716302 B1 | 3/2017 |
| KR | 10-2127574 B1 | 6/2020 |

OTHER PUBLICATIONS

Yang, L., X. Hao, C. Wang, B. Zhang, W. Wang, Rapid and low cost replication of complex microfluidic structures with PDMS double casting technology, Microsystems Technology, vol. 20 (2014), pp. 1933-1940. (Year: 2014).*

Xia, Y. and G.M. Whitesides, Soft Lithography, Annu. Rev. Mater. Sci, vol. 28 (1998), pp. 153-184. (Year: 1998).*

Xin Xie et al., "A Modular, Reconfigurable Microfabricated Assembly Platform for Microfluidic Transport and Multitype Cell Culture and Drug Testing", Micromachines (Basel), Dec. 18, 2019, 11(1):2. doi: 10.3390/mi11010002.

Juyeol Bae et al., "Double-Sided Microwells with a Stepped Through-Hole Membrane for High-Throughput Microbial Assays", Analytical Chemistry, Jun. 23, 2020, 92, 14, 9501-9510, DOI:10.1021/acs.analchem.0c00037.

* cited by examiner

1. Surface modification with PFOCTS

M

2. Spin coating PVA on glass

3. Attach PDMS mold to PVA-coated glass

Degassing of air

4. Negative pressure-driven loading of Ostemer solution

5. UV exposure & demolding

5. Baking at 80 °C

6. Removal of PVA sacrificial layer

1. Surface modification with PFOCTS

M

2. ADD A DROP OF CURING AGENT

3. PRESSURIZE CURING AGENT WITH SILICON MOLD

4. Negative pressure-driven loading of Ostemer solution

5. UV exposure & demolding

5. Baking at 80 °C

6. Removal of PVA sacrificial layer 231 232
230
240
220
200

FIG. 8

1. Surface modification with PFOCTS

M

2. Attach PDMS mold to PVA-coated glass

Degassing of air

3. Loading of Ostemer resin

4. Transfer to rigid substrate

100 rigid substrate

1. Preparation of the three parts

2. Surface modification

3. Alignment between the film and baking

4. Baking at 80 °C

5. Removal of PVA sacrificial layer

MICROFLUIDIC MODULE AND METHOD OF FABRICATING THE MICROFLUIDIC MODULE

CROSS-REFERENCE TO RELATED APPLICATION

This application claims the benefit of Korean Patent Application No. 10-2021-0126358, filed on Sep. 24, 2021, in the Korean Intellectual Property Office, the disclosure of which is incorporated herein in its entirety by reference.

TECHNICAL FIELD

The present invention relates to a microfluidic module and a method of fabricating the microfluidic module, and more particularly, to a microfluidic module including a microfluidic film including a microchannel, a base film and a through passage for fluid communication with another base film stacked on or below the base film, and a method of fabricating the microfluidic module.

BACKGROUND ART

Various electronic components have been developed and integrated in a two-dimensional space and developed as modern integrated circuit (IC) chips. By the way, when electronic circuits are constituted in a two-dimensional (2D) plane, circuit configuration is complicated due to space limitation. Currently, in order to solve this problem, logic circuits are stacked not in a horizontal direction but in a vertical direction. However, it is not easy to perform organic connection of circuits when configuring three-dimensional circuits stacked in the vertical direction compared to a case where circuit configuration is performed in a 2D plane. For organic connection between three-dimensional (3D) circuits, interest in through-silicon via (TSV) technology is increasing.

These points may be similarly applied to microfluidics. As a measure for solving these problems, in microfluidics, a method of fabricating through-holes based on silicon etching using photolithography may be introduced. However, because extensive photomasks are required in a photolithography process and complicated processes, such as exposure and development, are required, process cost is too high. Thus, in order to solve this cost problem, a method of fabricating through-holes by continuously making molds having a desired structure by using soft-lithography may be introduced. However, because these molds are disposable, cost reduction is possible, but mass production is difficult.

DISCLOSURE OF THE INVENTION

The present invention provides a microfluidic module including a microfluidic film including a microchannel, a base film and a through passage for fluid communication with another base film stacked on or below the base film, and a method of fabricating the microfluidic module.

According to an aspect of the present invention, there is provided a microfluidic module including a first microfluidic film including a first base film, a first microchannel, which is formed on the first base film and through which a fluid flows, and a first through passage, which is configured to pass through the first base film, and a second microfluidic film including a second base film being stacked on the first base film and a second through passage, which is configured to pass through the second base film and communicates with the first through passage.

According to another aspect of the present invention, there is provided a microfluid module including a first microfluidic film including a first base film, a first microchannel, which is formed on the first base film and through which a fluid flows, and a first through passage, which is configured to pass through the first base film, and a second microfluidic film including a second base film being stacked on the first base film and a second microchannel, which is formed on the second base film and communicates with the first through passage.

According to another aspect of the present invention, there is a method of fabricating a microfluidic module, the method including: fabricating a basic mold, the basic mold including a base member, a first base groove formed on the base member to extend in a longitudinal direction and having a storage space therein, a second base groove formed on the base member, being spaced apart from the first base groove and having a storage space therein, and a third base groove formed between the first base groove and the second base groove so that the first base groove and the second base groove communicate with each other; fabricating a master mold that is repeatedly usable by using the basic mold as a template; fabricating a first microfluidic film by using the master mold as a template, the first microfluidic film including a first microchannel through which a fluid flows and a first through passage for communicating with the microfluidic film stacked on an upper portion or a lower portion of the first microchannel, fabricating a second microfluidic film by using the master mold as a template, the second microfluidic film including a second microchannel through which a fluid flows and a second through passage for communicating with the first through passage or the first microchannel, and aligning the second microfluidic film on the first microfluidic film and attaching the second microfluidic film to the first microfluidic film so that the first through passage communicates with the second through passage or the second microchannel.

A microfluidic module and a method of fabricating the microfluidic module according to the present invention have the following effects.

First, because the microfluidic film includes a base film, a microfluidic channel and a through passage for fluid communication with another base film stacked on or below the base film, fluid movement between the stacked base films is possible.

Second, the microfluidic film including both the microfluidic channel and the through passage can be produced with low cost by using a pre-fabricated master mold.

Third, because the master mold can be repeatedly used, a microfluidic module including the microfluidic channel and the through passage can be mass-produced.

DETAILED DESCRIPTION FOR CARRYING OUT THE INVENTION

Hereinafter, the present invention will be described in detail with reference to the accompanying drawings, in which exemplary embodiments of the invention are shown.

A microfluidic module according to an embodiment of the present invention includes a first microfluidic film and a second microfluidic film. In the present embodiment, the first microfluidic film and the second microfluidic film are the same. Thus, hereinafter, the first microfluidic film and the second microfluidic film are distinguished from each other, and for convenience, are expressed as a microfluidic film. When distinguishment is required, it is specifically named as the first microfluidic film and the second microfluidic film. First, a microfluidic film that constitutes the microfluidic module will be described.

Referring to FIGS. 1 through 6, a microfluidic film 100 includes a base film 110, a microchannel 120, a through passage 130, and a connection channel 140. The base film 110 is a portion that constitutes the appearance (framework) of the microfluidic film 100. In other words, the microfluidic film 100 has a structure in which the microchannel 120, the through passage 130 and the connection channel 140 are formed on the base film 110. In the present embodiment, the base film 110 is formed of resin. In detail, the base film 110 is formed of an Off-stoichiometry thiol-ene polymers (OSTEmer) resin, but any material of the base film 110 may be changed.

Figure 1:
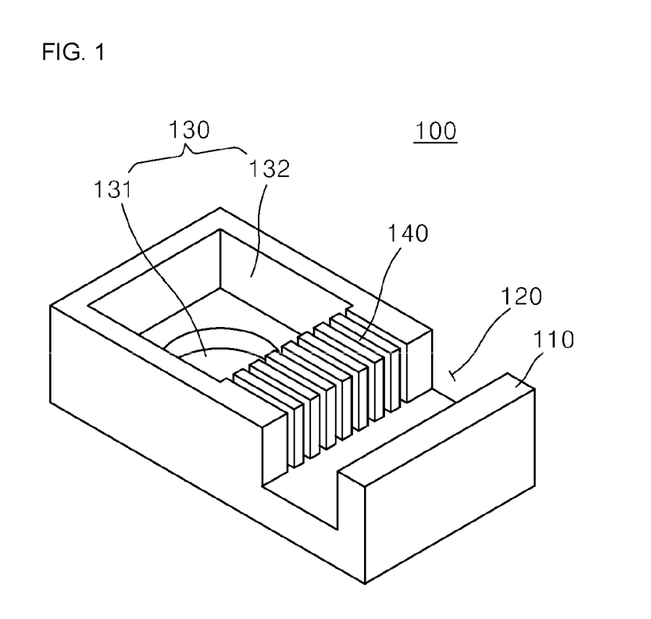
FIG. 1 is a schematic diagram of a microfluidic film that constitutes a microfluidic module according to an embodiment of the present invention.

The microchannel 120 is formed on the base film 110 so that a fluid may flow through the microchannel 120. The microchannel 120 is formed on the base film 110 in a longitudinal direction. In the present embodiment, the microchannel 120 is formed in the form of a groove on the base film 110. In the present embodiment, the microchannel 120 is a micro-scale or nano-scale channel. However, any size of the microchannel 120 may be changed.

The through passage 130 is formed to pass through the base film 110. The through passage 130 is formed to fluid-communicate with another base film stacked on or below the base film 110. That is, the through passage 130 is a passage on which the fluid does not flow only inside the base film 110 but flows to another base film outside the base film 110. In the present embodiment, the through passage 130 has a hole structure in which the through passage 130 is spaced apart from the microchannel 120 and passes through the base film 110 from a top surface to a bottom surface of the base film 110.

The through passage 130 includes a through passage lower hole 131 and a through passage upper hole 132. The through passage lower hole 131 is a portion that extends from the lower portion of the through passage 130 upward by a set length. The through passage upper hole 132 is a portion that communicates with the upper portion of the through passage lower hole 131 and extends upward. In this case, in the present embodiment, the through passage upper hole 132 has a greater width than that of the through passage lower hole 131. Thus, a step height is formed between the through passage upper hole 132 and the through passage lower hole 131. In the present embodiment, the vertical length of the through passage upper hole 132 is greater than the vertical length of the through passage lower hole 131. In detail, the through passage upper hole 132 has the vertical length of 60 μm, and the through passage lower hole 131 has the vertical length of 20 μm.

The connection channel 140 allows the microchannel 120 and the through passage 130 to communicate with each other. That is, one side of the connection channel 140 communicates with the microchannel 120, and the other side of the connection channel 140 communicates with the through passage 130. In the present embodiment, the connection channel 140 is formed in a horizontal direction crossing the longitudinal direction in a two-dimensional plane of the base film 110. In the present embodiment, a plurality of connection channel 140 are spaced from each other in the longitudinal direction. Of course, the structure of the connection channel 140 may be changed into any structure in which the microchannel 120 and the through passage 130 may communicate with each other. In the present embodiment, the connection channel 140 is formed in the form of a groove on the base film 110.

Hereinafter, a method of fabricating the microfluidic film 100 will be described with reference to FIGS. 1 through 6.

Figure 2:
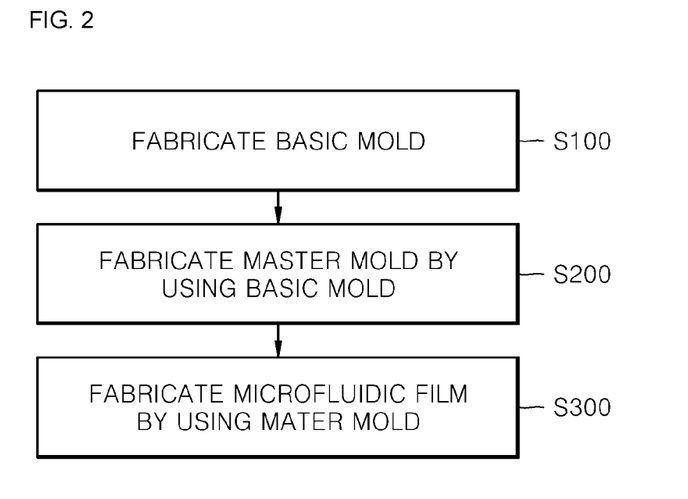
FIG. 2 is a block diagram illustrating an operation of fabricating a microfluidic film of a method of fabricating a microfluidic module according to an embodiment of the present invention.
Figure 3:
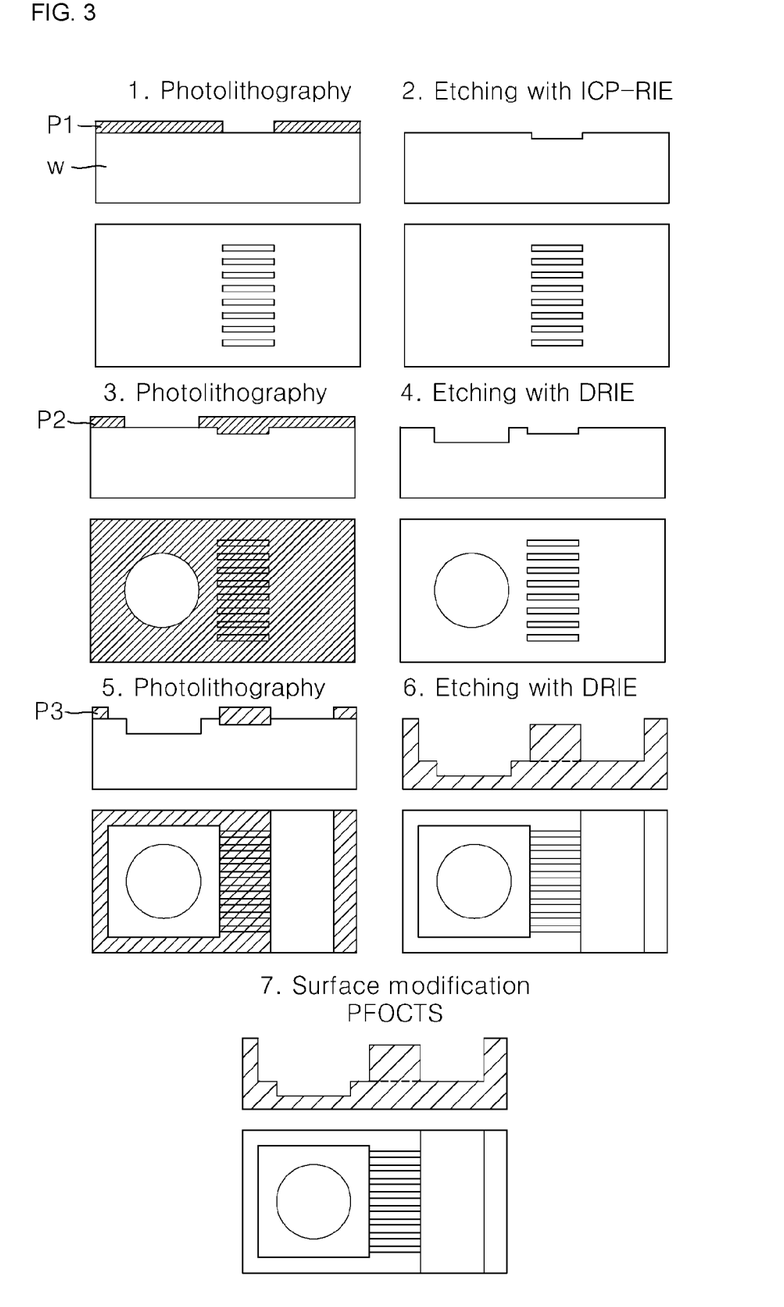
FIG. 3 is a schematic diagram illustrating a process of fabricating a basic mold that serves as a template for fabricating a master mold of the method of fabricating the microfluidic film shown in FIG. 2.

The method of fabricating the microfluidic film 100 includes fabricating a basic mold B (S100), fabricating a master mold by using the basic mold B (S200), and fabricating a microfluidic film by using the master mold (S300). The fabricating of the basic mold B (S100) is a process of fabricating a mold for fabricating the master mold. In the present embodiment, in the fabricating of the basic mold B (S100), the basic mold B is fabricated using a photolithography process. The basic mold B includes a base member formed of a silicon wafer, and the base member includes a first base groove having a storage space formed therein, a second base groove being spaced from the first base groove 130 and having a storage space formed therein, and a third base groove through which the first base groove and the second base groove communicate with each other. In the present embodiment, the first base groove includes a first base lower groove having a small width of a lower part, and a first base upper groove that communicates with an upper part of the first base lower groove and extends upward.

Although it will be described below, the first base groove has a structure for forming the through passage 130 of the microfluidic film 100. The second base groove has a structure for forming the microchannel 120 of the microfluidic film 100. The third base groove has a structure for forming the connection channel 140 of the microfluidic film 100.

The fabricating of the basic mold B (S100) undergoes a first exposure operation in which a first photoresist is applied onto the silicon wafer and a first mask having a first pattern for forming the third base groove formed thereon is disposed at an upper portion of the first photoresist and then light is irradiated onto the first mask. Next, the fabricating of the basic mold B (S100) undergoes a first etching operation in which the silicon wafer that has undergone the first exposure operation is etched by using a developing agent. In the present embodiment, the first photoresist is a SU-8 photoresist.

Next, a second exposure operation in which, after the first photoresist is removed, a second photoresist is applied onto the silicon wafer, a second mask having a second pattern for forming the first base lower groove formed thereon is disposed at an upper portion of the second photoresist and then light is irradiated onto the second mask, is performed. A second etching operation in which the silicon wafer that has undergone the second exposure operation is etched by using the developing agent, is performed.

Next, a third exposure operation in which, after the second photoresist is removed, a third photoresist is applied onto the silicon wafer, a third mask having a third pattern for forming the first base upper groove formed thereon and a fourth pattern for forming the second base groove formed thereon is disposed at an upper portion of the third photoresist and then light is irradiated onto the third mask, is performed. A third etching operation in which the silicon wafer that has undergone the third exposure operation is etched by using the developing agent, is performed.

In the silicon wafer according to the present embodiment, the vertical length of the first base upper groove and the vertical length of the second base groove are the same. However, the vertical length of the first base lower groove is smaller than the vertical length of the first base upper groove and the vertical length of the second base groove. In detail, the vertical length of the first base upper groove and the vertical length of the second base groove are the same, 60 μm, and the vertical length of the first base lower groove is formed to be 20 μm.

The width of the cross-section of the first base lower groove is smaller than the width of the cross-section of the first base upper groove. Thus, the first base lower groove and the first base upper groove form a step height. This serves to help the master mold from being easily separated from the basic mold B when the master mold is fabricated through a soft-lithography process by using the basic mold B.

Figure 4:
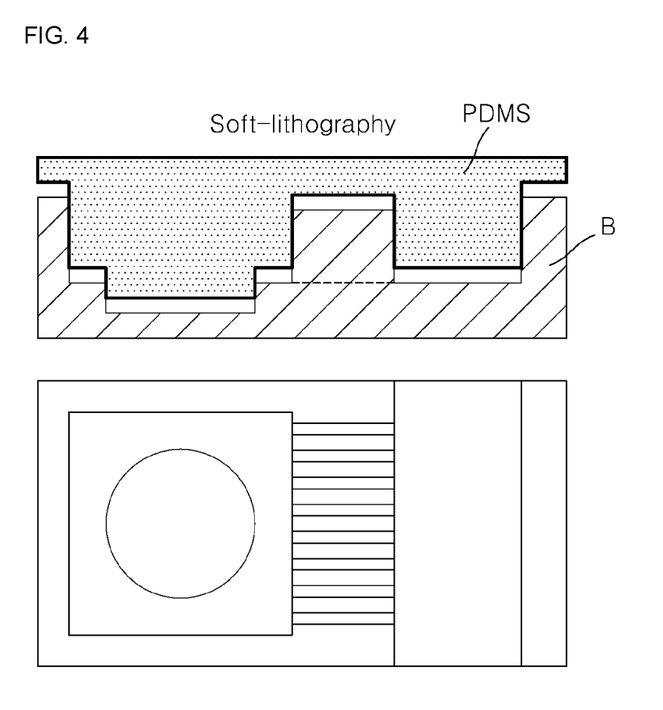
FIG. 4 is a schematic diagram illustrating a process of fabricating a master mold of the method of fabricating the microfluidic film shown in FIG. 2.

In fabricating of the master mold (S200), the master mold is fabricated by using the basic mold B as a template. In the present embodiment, the master mold formed of polydimethylsiloxane (PDMS) is fabricated by using the soft-lithography process. That is, in the present embodiment, PDMS in a liquid state is injected into the basic mold B and then is cured so that the master mold is fabricated. Any type of polymer for fabricating the master mold may be changed.

Figure 5:
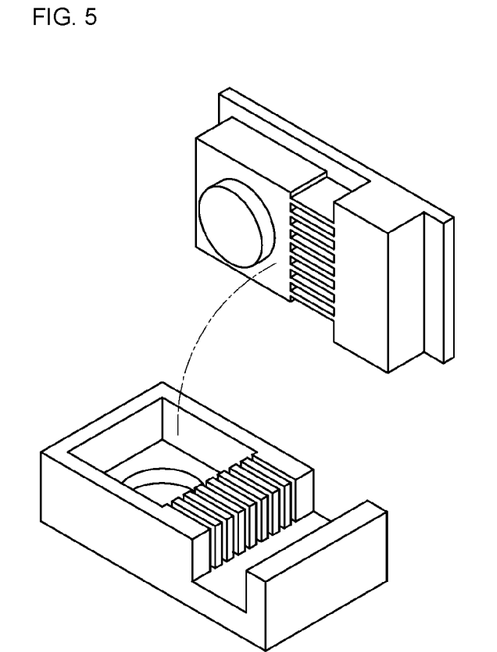
FIG. 5 is a schematic diagram illustrating a state in which the master mold fabricated according to FIG. 4 is separated from the basic mold.

Because the master mold is complementarily coupled to the basic mold B, a first protrusion is formed in a portion corresponding to the first base groove, a second protrusion is formed in a portion corresponding to the second base groove, and a groove is formed in a portion corresponding to the third base groove. In particular, the second protrusion has a structure in which widths in a vertical direction are the same. However, a portion of the first protrusion corresponding to the first base lower groove has a small width, and a portion of the first protrusion corresponding to the first base upper grove has a large width.

In the present embodiment, the master mold is formed of a material having higher rigidity than that of the basic mold B. Thus, the mater mold may be repeatedly used, unlike in the basic mold B. In the method of fabricating the microfluidic film according to the present embodiment, cost may be reduced, and mass production is possible compared to a case where the microfluidic film is directly fabricated in a way to fabricate the basic mold B by using the silicon wafer.

Figure 6:
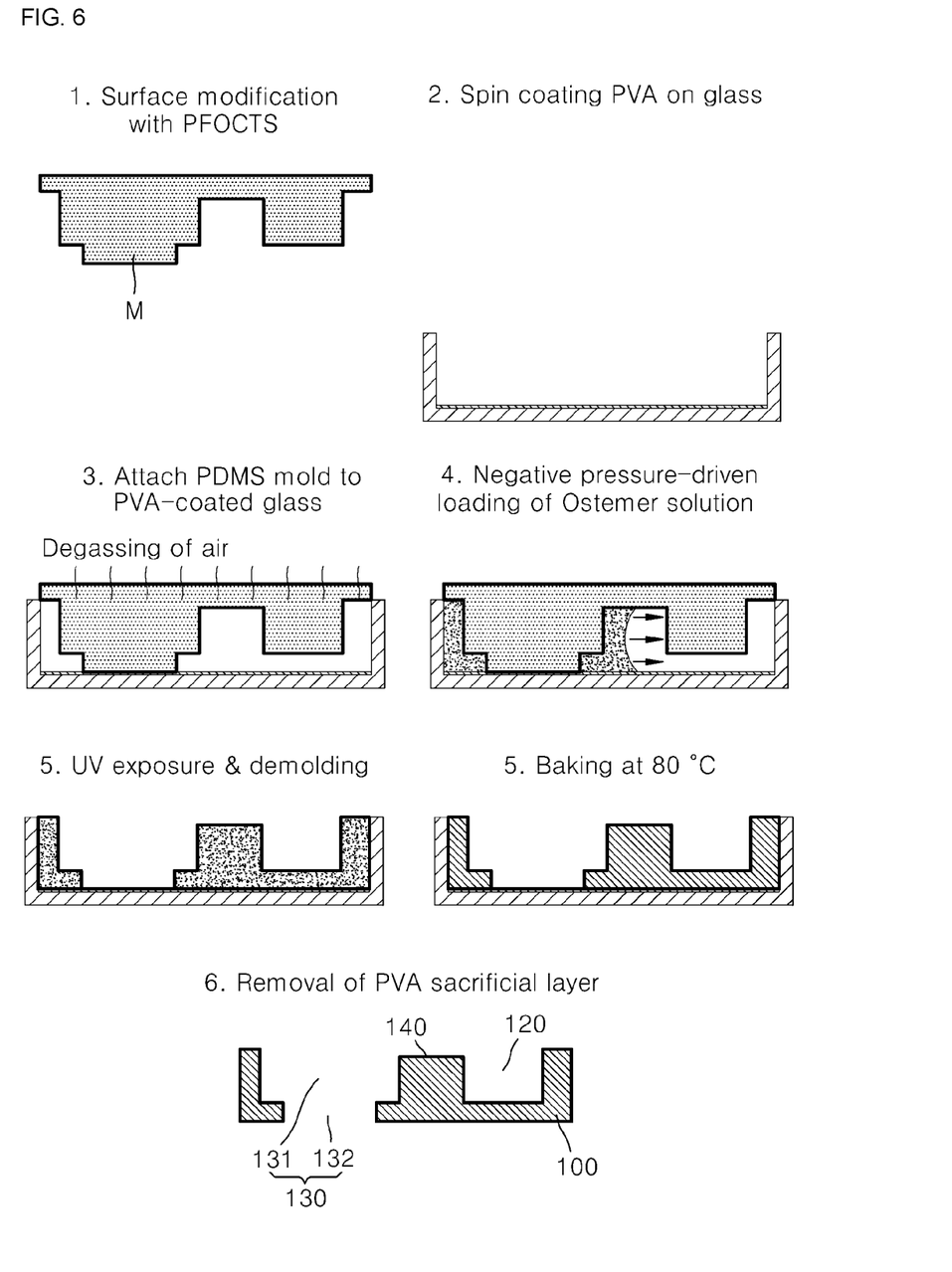
FIG. 6 is a schematic diagram illustrating a method of fabricating a microfluidic film by using the master mold of the method of fabricating the microfluidic film shown in FIG. 2.

The fabricating of the microfluidic film (S300) is a process in which the microfluidic film 100 including the microchannel 120 and the through passage 130 is fabricated by using the master mold as a template. First, the master mold is surface-modified with perfluorooctyltrimethoxysilane (PFOCTS). Next, a glass substrate for forming a template for manufacturing the microfluidic film 100 is prepared together with the master mold. In this case, the master mold is well attached to the glass substrate, and polyvinyl alcohol (PVA) that is soluble in water is spin-coated.

Next, the master mold is attached onto the glass substrate so that the protruding lower portion of the master mold faces the glass substrate coated with PVA. Next, an OSTEmer resin is loaded between the master mold and the glass substrate. Subsequently, the OSTEmer resin is cured with ultraviolet light (UV) 312 nm. In this case, a curing process by UV makes the OSTEmer resin hard but soft.

Next, the master mold that is reusable is removed. In a state in which the master mold is removed, the cured OSTEmer resin is baked at 80° C. By removing the glass substrate and PVA, the microfluidic film 100 is fabricated.

Figure 7:
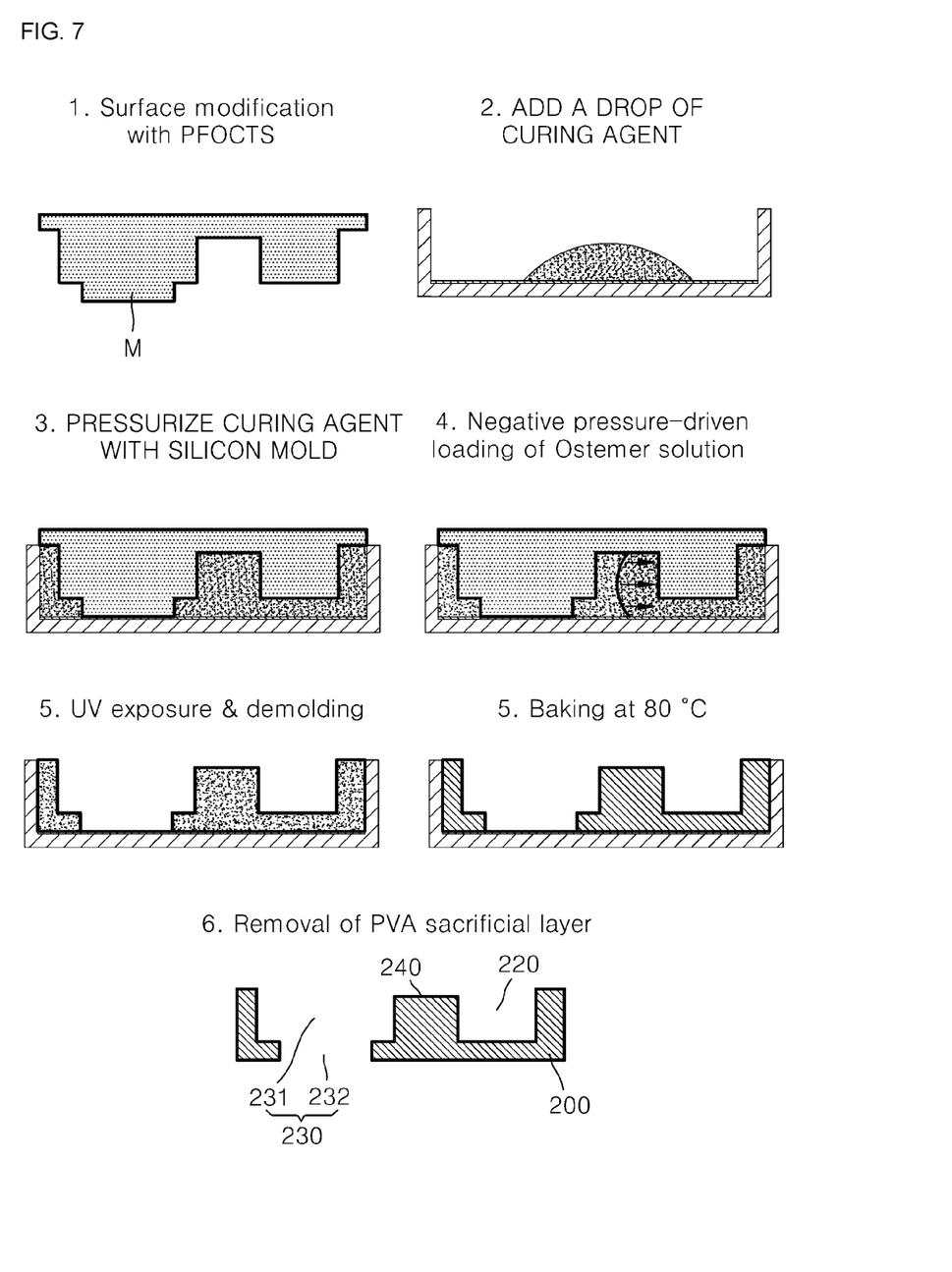
FIG. 7 is a schematic diagram illustrating an operation of fabricating a microfluidic film of a method of fabricating a microfluidic module according to another embodiment of the present invention.

Referring to FIG. 7, a method of fabricating a microfluidic film that is different from that of FIGS. 2 through 6 is shown. The method of fabricating the microfluidic film shown in FIG. 7 is different from the method of fabricating the microfluidic film shown in FIGS. 2 through 6 that the microfluidic film is fabricated by using not the master mold of PDMS but the master mold of silicon. That is, after the master mold formed of silicon is fabricated by using the basic mold B made in FIG. 3, the microfluidic film is fabricated by using the master mold of silicon. Other procedures are similar to those of the method of fabricating the microfluidic film shown in FIGS. 2 through 6 and thus, a detailed description thereof is omitted.

First, the master mold is surface-modified with PFOCTS. Next, a glass substrate for forming a template for fabricating the microfluidic film 200 is prepared together with the master mold. In this case, the master mold is well attached to the glass substrate, and the glass substrate is spin-coated with PVA that is soluble in water. Then, a drop of curing agent is added to the glass substrate coated with PVA.

Next, the curing agent is pressurized with a portion of the master mold having an uneven structure (protrusions and grooves) that may be complementarily coupled to the master mold so that the curing agent is uniformly formed between the glass substrate and the master mold.

Next, the OSTEmer resin is loaded between the master mold and the glass substrate. Subsequently, the OSTEmer resin is cured with UV 312 nm. In this case, the curing process by UV makes the OSTEmer resin hard but soft.

Next, the master mold is removed. In a state in which the master mold is removed, the cured OSTEmer resin is baked at 80° C. Then, by removing the glass substrate and PVA, the microfluidic film 200 is fabricated.

Figure 8:
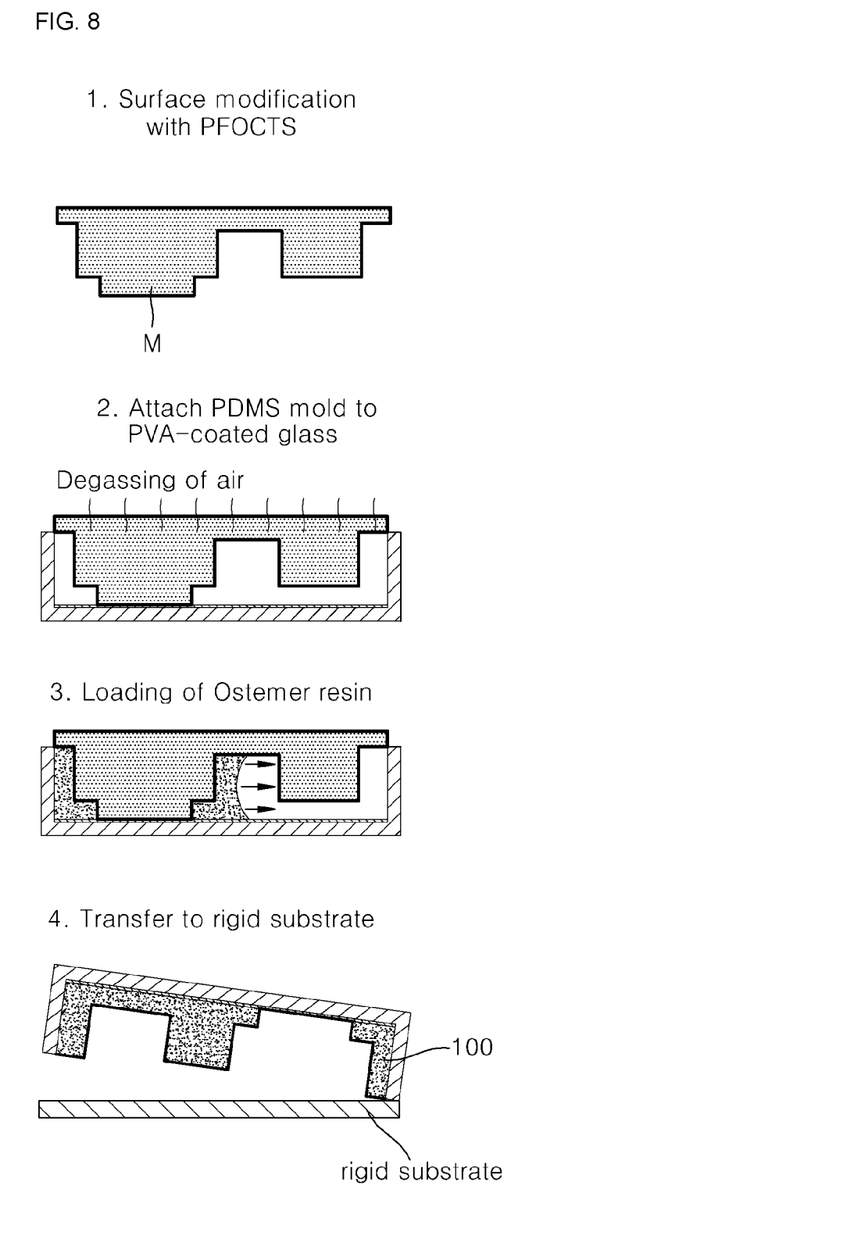
FIG. 8 is a schematic diagram illustrating an operation of transferring a microfluidic film fabricated by the method of fabricating the microfluidic film shown in FIG. 2, to a rigid substrate.

Referring to FIG. 8, a process in which the microfluidic film 100 fabricated according to FIG. 6 is disposed on a rigid substrate, is illustrated. This process is a process in which the microfluidic film 100 is attached to the rigid substrate to fabricate a two-dimensional fluidic module. In this case, the rigid substrate is formed of a material having higher rigidity than that of the microfluidic film 100.

Figure 9:
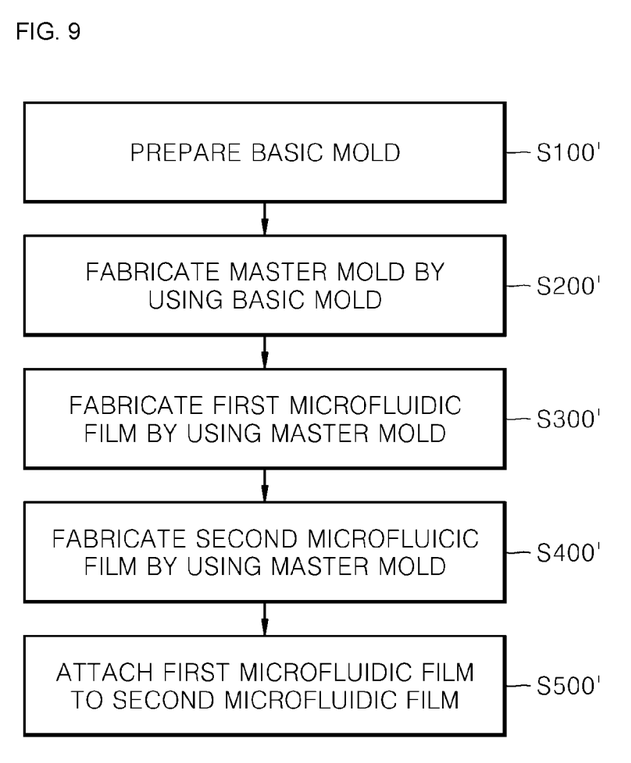
FIG. 9 is a block diagram illustrating a method of fabricating a microfluidic module by attaching a plurality of microfluidic films in the method of fabricating the microfluidic film shown in FIG. 2.
Figure 10:
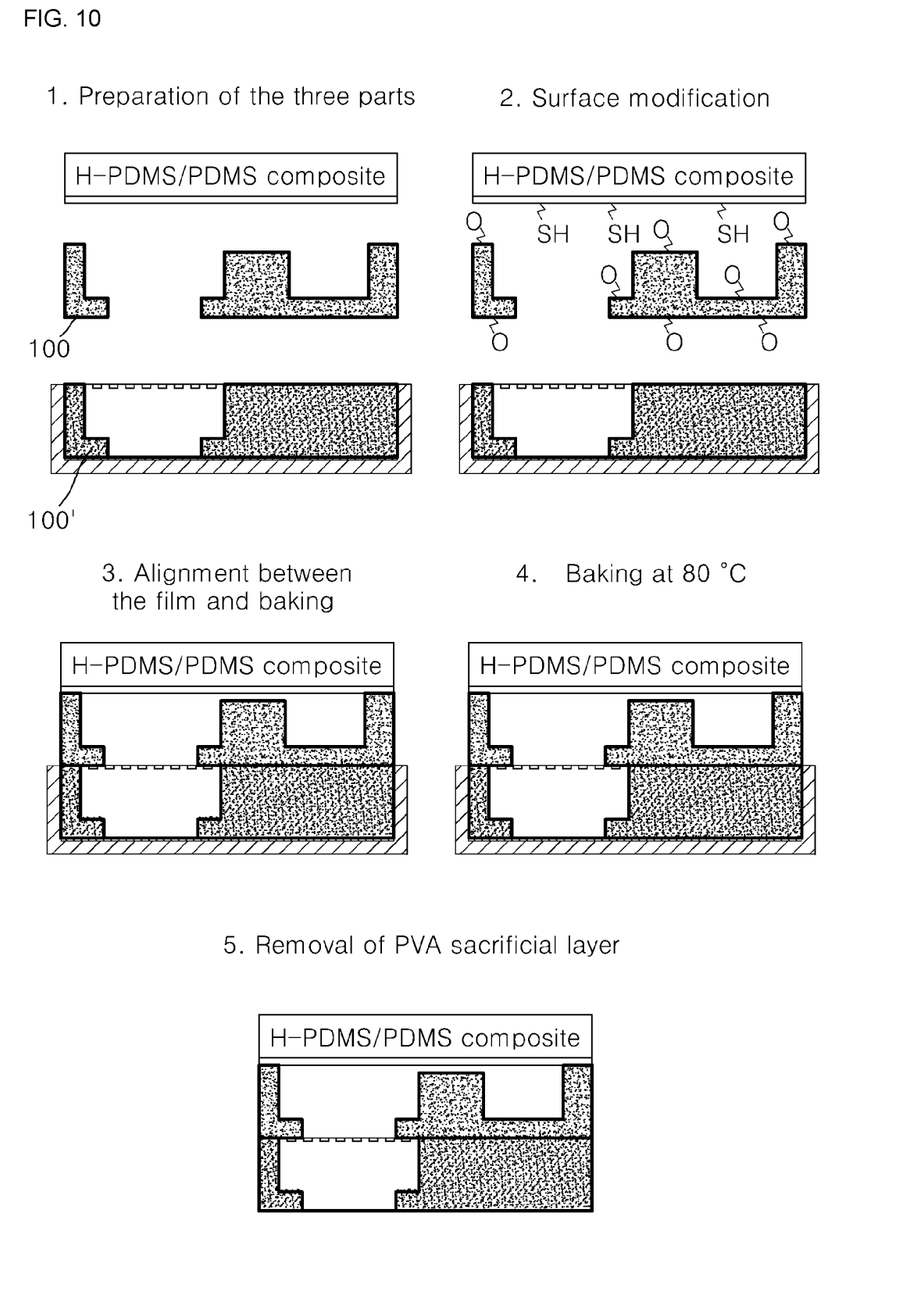
FIG. 10 is a schematic diagram illustrating a method of attaching a plurality of microfluidic films so as to fabricate the microfluidic module shown in FIG. 9.

Referring to FIGS. 9 and 10, a method of fabricating a microfluidic module according to another embodiment of the present invention includes preparing a basic mold (S100'), fabricating a master mold by using the basic mold (S200'), fabricating a first microfluidic film by using the master mold (S300'), fabricating a second microfluid film by using the master mold (S400'), and stacking the first microfluidic film and the second microfluidic film and attaching the first microfluidic film to the second microfluidic film (S500'). That is, the microfluidic module fabricated by the method according to the present embodiment includes the first microfluidic film and the second microfluidic film.

The preparing of the basic mold (S100'), the fabricating of the master mold by using the basic mold (S200'), the fabricating of the first microfluidic film by using the master mold (S300'), and the fabricating of the second microfluid film by using the master mold (S400') of the method of fabricating the microfluidic module according to the present embodiment are similar to those of the method of fabricating the microfluidic film) shown in FIGS. 2 through 6. That is, the method of fabricating the microfluidic module according to the present embodiment includes preparing and stacking a plurality of microfluidic films fabricated in FIGS. 2 through 5. Thus, a detailed description of the preparing of the basic mold (S100'), the fabricating of the master mold by using the basic mold (S200'), the fabricating of the first microfluidic film by using the master mold (S300'), and the fabricating of the second microfluid film by using the master mold (S400') is omitted.

Referring to FIG. 10, FIG. 10 illustrates a process of attaching a first microfluidic film 1100 to a second microfluidic film 1100'. First, the first microfluidic film 1100 and the second microfluidic film 1100' are prepared. In the present embodiment, the first microfluidic film 1100 includes a first base film, a first microchannel, which is formed on the first base film and through which a fluid flows, a first through passage configured to pass through the first base film, and a first connection channel through which the first microchannel and the first through passage communicate with each other. The second microfluidic film 1100' includes a second base film stacked on the first base film, and a second through passage, which is configured to pass through the second base film and communicates with the first through passage. However, the present invention is not limited thereto, and the second microfluidic film 1100' may further include a second microchannel through which the fluid flows on the second base film, and a second connection channel allowing the second microchannel and the second through passage to communicate with each other. Also, the first through passage may be formed to communicate with not the second through passage but the second microchannel.

The first microfluid film 1100 according to the present embodiment is fabricated by undergoing a process of curing the OSTEmer resin with UV 312 nm in FIG. 6 and removing the master mold that is reusable. The second microfluidic film 1100' is fabricated through all processes of FIG. 6.

Next, the stacking of the first microfluidic film 1100 and the second microfluidic film 1100' and the attaching of the first microfluidic film 1100 to the second microfluidic film 1100' (S500') will be described. First, the first microfluidic film 1100 is disposed at a lower portion of a glass substrate.

A base layer is attached to the second microfluidic film 1100'. In the present embodiment, the base layer is a hard-polydimethylsiloxane (H-PDMS) complex. However, any material of the base layer may be changed. In this case, surface modification is first performed. An opposite side of the second microfluidic film 1100' to a portion in which the base layer is formed, is aligned on the first microfluidic film 1100 and is baked at 80° C. Next, the glass substrate disposed at a lower portion of the first microfluidic film 1100 and PVA are removed to fabricate a microfluidic module.

A microfluidic module and a method of fabricating the microfluidic module according to the present invention have the following effects.

First, because the microfluidic film includes a base film, a microfluidic channel and a through passage for fluid communication with another base film stacked on or below the base film, fluid movement between the stacked base films is possible.

Second, the microfluidic film including both the microfluidic channel and the through passage can be produced with low cost by using a pre-fabricated master mold.

Third, because the master mold can be repeatedly used, a microfluidic module including the microfluidic channel and the through passage can be mass-produced.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of fabricating a microfluidic module, the method comprising:
    fabricating a basic mold, the basic mold comprising a base member, a first base groove formed on the base member to extend in a longitudinal direction and having a storage space therein, a second base groove formed on the base member, being spaced apart from the first base groove and having a storage space therein, and a third base groove formed between the first base groove and the second base groove so that the first base groove and the second base groove communicate with each other;
    fabricating a master mold that is repeatedly usable by using the basic mold as a template;
    fabricating a first microfluidic film by using the master mold as a template, the first microfluidic film comprising a first microchannel through which a fluid flows and a first through passage for communicating with the microfluidic film stacked on an upper portion or a lower portion of the first microchannel;
    fabricating a second microfluidic film by using the master mold as a template, the second microfluidic film comprising a second microchannel through which a fluid flows and a second through passage for communicating with the first through passage or the first microchannel; and
    aligning the second microfluidic film on the first microfluidic film and attaching the second microfluidic film to the first microfluidic film so that the first through passage communicates with the second through passage or the second microchannel;
    wherein the fabricating of the basic mold comprises:
    a first exposure operation in which a first photoresist is applied onto a wafer, a first mask having a first pattern corresponding to a connection channel through which the microchannel and the through passage communicate with each other, is disposed at an upper portion of the first photoresist and light is irradiated to the first mask;

a first etching exposure operation in which the wafer that has undergone the first exposure operation is etched by using a developing agent;

a second exposure operation in which, after the first photoresist is removed, a second photoresist is applied onto the wafer, a second mask having a second pattern corresponding to the through passage is disposed at an upper portion of the second photoresist and light is irradiated onto the second mask;

a second etching operation in which the wafer that has undergone the second exposure operation is etched by using a developing agent;

a third exposure operation in which, after the second photoresist is removed, a third photoresist is applied onto the wafer, a third mask having a third pattern formed at a position corresponding to the microchannel and a fourth pattern being spaced apart from the third pattern, being formed at a position corresponding to the second pattern of the second mask and having a greater width than a width of the second pattern of the second mask is disposed at an upper portion of the third photoresist and light is irradiated onto the third mask; and a third etching operation in which the wafer that has undergone the third exposure operation is etched by using a developing agent.

2. The method of claim 1, wherein, in the wafer, a vertical length formed by the third pattern and a vertical length formed by the fourth pattern are the same.

3. The method of claim 2, wherein a width of a cross-section of a structure formed by the second pattern is smaller than a width of a cross-section of a structure formed by the fourth pattern so that the structure formed by the second pattern forms a step height with the structure formed by the fourth pattern.

4. The method of claim 3, wherein a vertical length formed by the second pattern is greater than a vertical length formed by the fourth pattern.

5. The method of claim 4, wherein, in the fabricating of the master mold, polymer is injected into the basic mold having a shape corresponding to the microfluidic film and is cured to fabricate the master mold.

6. The method of claim 5, wherein the polymer comprises Polydimethylsiloxane (PDMS).

7. The method of claim 1, wherein, in the fabricating of the master mold, the master mold of polydimethylsiloxane (PDMS) is fabricated by using a soft-lithography process.

8. A method of fabricating a microfluidic module, the method comprising:

fabricating a basic mold, the basic mold comprising a base member, a first base groove formed on the base member to extend in a longitudinal direction and having a storage space therein, a second base groove formed on the base member, being spaced apart from the first base groove and having a storage space therein, and a third base groove formed between the first base groove and the second base groove so that the first base groove and the second base groove communicate with each other;

fabricating a master mold that is repeatedly usable by using the basic mold as a template;

fabricating a first microfluidic film by using the master mold as a template, the first microfluidic film comprising a first microchannel through which a fluid flows and a first through passage for communicating with the microfluidic film stacked on an upper portion or a lower portion of the first microchannel;

fabricating a second microfluidic film by using the master mold as a template, the second microfluidic film comprising a second microchannel through which a fluid flows and a second through passage for communicating with the first through passage or the first microchannel; and aligning the second microfluidic film on the first microfluidic film and attaching the second microfluidic film to the first microfluidic film so that the first through passage communicates with the second through passage or the second microchannel, wherein the fabricating of the microfluidic film comprises:

modifying a surface of the master mold;

preparing a glass substrate for forming a template for fabricating the microfluidic film together with the master mold;

attaching a portion of the master mold having an uneven structure that is complementarily coupled to the basic mold, onto the glass substrate;

loading a resin for forming the microfluidic film between the master mold and the glass substrate and curing the resin;

separating the master mold from the cured resin; and separating the glass substrate from the cured resin;

between the preparing of the glass substrate and the attaching of the master mold onto the glass substrate;

disposing a curing agent on the glass substrate; and pressurizing the curing agent with a portion of the master mold having an uneven structure that is complementarily coupled to the basic mold so that the curing agent is uniformly formed between the glass substrate and the master mold.

9. The method of claim 8, wherein the preparing of the glass substrate further comprises coating the glass substrate with polyvinyl alcohol (PVA) so that the master mold is well attached onto the glass substrate.

\* \* \* \* \*